United States Patent
Zhou et al.

(10) Patent No.: US 10,684,669 B1
(45) Date of Patent: Jun. 16, 2020

(54) LOGIC LEVEL SHIFTER INTERFACE BETWEEN POWER DOMAINS

(71) Applicant: Maxim Integrated Products, Inc., San Jose, CA (US)

(72) Inventors: Xin Zhou, Nashua, NH (US); Brett A. Miwa, Wellesley Hills, MA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 16/049,747

(22) Filed: Jul. 30, 2018

Related U.S. Application Data (60) Provisional application No. 62/537,960, filed on Jul. 28, 2017.

(51) Int. Cl.
| | |
|---|---|
| *H03K 19/0185* | (2006.01) |
| *G06F 1/3234* | (2019.01) |
| *H03K 19/0175* | (2006.01) |
| *H03K 19/00* | (2006.01) |

(52) U.S. Cl.
CPC ....... *G06F 1/3234* (2013.01); *H03K 19/0008* (2013.01); *H03K 19/017509* (2013.01)

(58) Field of Classification Search
CPC .............. G06F 1/3234; H03K 19/0008; H03K 19/017509
See application file for complete search history.

(56) References Cited

U.S. PATENT DOCUMENTS

| | | | | |
|---|---|---|---|---|
| 5,808,480 | A * | 9/1998 | Morris | H03K 19/01852 326/81 |
| 6,025,737 | A * | 2/2000 | Patel | H03K 19/0027 326/68 |
| 6,759,907 | B2 * | 7/2004 | Orr | H03F 1/18 330/286 |
| 7,397,273 | B1 * | 7/2008 | Ng | H03K 19/173 326/38 |
| 9,361,995 | B1 * | 6/2016 | Tran | G11C 5/145 |
| 10,050,625 | B2 * | 8/2018 | Oak | H03K 19/01852 |
| 2005/0156630 | A1 * | 7/2005 | Takiba | H03K 19/018521 326/81 |
| 2008/0309395 | A1 | 12/2008 | Kaneko et al. | |
| 2014/0145777 | A1 * | 5/2014 | Ma | H03K 3/356165 327/333 |

(Continued)

*Primary Examiner* — Alexander H Taningco
*Assistant Examiner* — Kurtis R Bahr
(74) *Attorney, Agent, or Firm* — TIPS Group (57) ABSTRACT

A logic level shifter interface including a string of logic components communicating between a first power domain and a second power domain; a first string of resistive components connecting a first power rail of the first power domain to a first power rail of the second power domain and having a plurality of intermediate first power rails at nodes between adjacent resistive components of the first string of resistive components; and a second string of resistive components connecting a second power rail of the first power domain to a second power rail of the second power domain and having a plurality of intermediate second power rails at nodes between adjacent resistive components of the second string of resistive components, where at least one logic component is powered by an intermediate first power rail of the first string of resistive components and an intermediate second power rail of the second string of resistive components.

20 Claims, 4 Drawing Sheets

(56) References Cited

U.S. PATENT DOCUMENTS

| | | | |
|---|---|---|---|
| 2016/0372453 A1* | 12/2016 | Suzuki | H01L 27/027 |
| 2017/0093401 A1* | 3/2017 | Lee | H01L 27/0928 |
| 2018/0097486 A1* | 4/2018 | Salem | H03F 3/2173 |
| 2018/0358969 A1* | 12/2018 | Davies | H03K 19/01852 |

* cited by examiner

LOGIC LEVEL SHIFTER INTERFACE BETWEEN POWER DOMAINS

CROSS REFERENCE TO RELATED APPLICATION

This application claims the benefit of U.S. Ser. No. 62/537,960, filed Jul. 28, 2017, incorporated herein by reference.

BACKGROUND

Digital electronic systems are often operated with multiple power domains. For example, a central processing unit (CPU) may have different power domains for its core, its input/output (I/O), and its various memories (e.g. DRAM, Flash), etc. Also, due to resistive and reactive elements found in, for example, integrated circuits (ICs) and the printed circuit boards (PCBs) on which these ICs are mounted, power domains that are nominally at the same voltage level may "bounce" in such a fashion that, for a transient period, they are operating at different voltage levels. If digital signals are being transmitted from one power domain to another, voltage transients or "bounce" can cause data errors. For example, in a system where two voltage domains are nominally at 2 volts (V) each, if a "noisy" domain has a bounce of 1V, data transmitted from a "quiet" domain to the noisy domain can be corrupted. As used herein, "noisy" refers to a power domain with appreciable power and/or ground rail bounce, and "quiet" refers to a power domain which the ground and power rail potentials are relatively stable. It is recognized that in typical applications, most power rails have non-zero noise.

In switching power converter IC design, a significant concern is how to transfer signal between a quiet ground domain and a noisy power ground domain. The power ground domain is typically noisy because, to achieve high power efficiency, power devices are required to switch very fast to reduce switching commutation loss. Fast di/dt changes across parasitic inductances in power ground paths can lead to large magnitude power ground (PG) ringing. In mobile core buck applications, the PG ringing can be more than +/−1V, with spectral content up to several hundred MegaHertz. In VRM/datacenter applications, PG ringing has been reported to be 1-3V. Many logic families cannot communicate reliably between power domains which differ by such large magnitudes.

A typical logic family has a noise margin, defined as the difference between the worst case output of the driving logic gate and the worst case input of the receiving logic gate, in the range of 10-20% of the logic rail voltage. With certain logic families, the noise margin may be as high at 50% of the logic rail ("logic") voltage. For example, 1.8V CMOS has a logic noise margin of around 200 mV. Power rail noise subtracts from this logic family noise margin, and when sufficiently large, can cause logic communication errors. Level shift logic elements have been used between domains to mitigate these errors.

As will be appreciated by those of ordinary skill in the art, Logic Noise Margin (LNM) is the difference between what the driver IC outputs as a valid logic voltage and what the receiver IC expects to see as a valid logic voltage. There are two different types of noise margin, one for a logic high value [1] and one for a logic low value [0]. For a valid logic high, the worst case noise margin for the circuit is the minimum high level voltage which may be output from the driver; minus, the minimum high level voltage which may be seen at the receiver IC. For a valid logic low, the worst case noise margin for the circuit is the maximum low level voltage which may be output from the driver; minus, the maximum low level voltage which may be seen at the receiver IC.

With such large magnitude PG ringing noise, it can be challenging to design level shifters to transfer signals between the power domains, especially if the noise magnitudes are comparable to the voltage ratings of the available level shift transistors. In prior art designs, high voltage devices were used to handle large PG ringing, to avoid device voltage rating issues or to pass the electrical rules checker.

Figure 1:
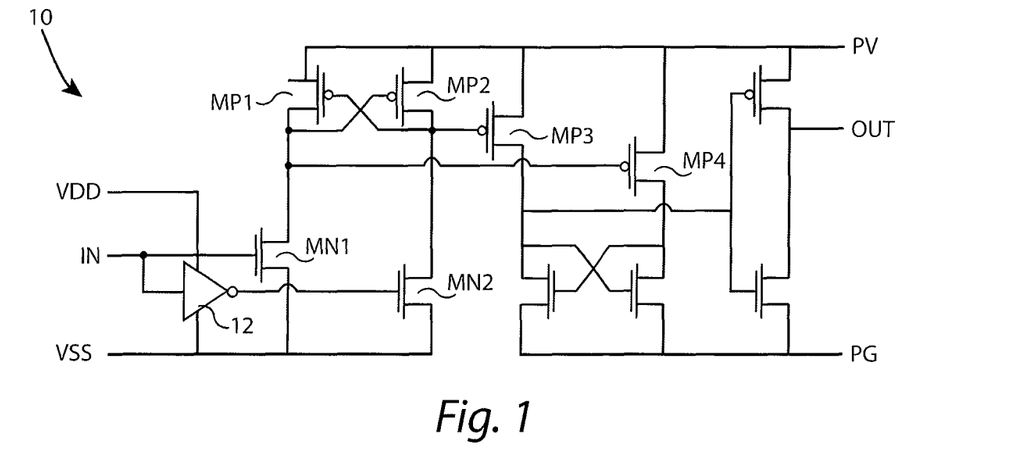
FIG. 1 is a schematic diagram of a prior art logic level shifter.

Prior art logic level shifters use high voltage devices to absorb the voltage differences between low voltage logic rails. For example, in FIG. 1, a logic level shifter 10 includes high voltage devices MN1, MN2, MP1, MP2, MP3, and MP4 to absorb voltage differences between the low voltage logic rails VDD and PV due to voltage differences between the PV/PG domain and the VDD/VSS domain. As an example, if VSS and PG are nominally at ground, and if VDD and PV are nominally at 2V, PV might reach, for example, 3V due to a bounce of 1V in PG. Therefore, while an inverter 12 can be made with 2V transistors, the transistors MN1, MN2, and MP1-MP4 must be made with at least 3V transistors, and more likely 5V transistors. This is disadvantageous in that using devices with higher voltage ratings compared to the standard logic gates 1) adds propagation delay; 2) limits low supply voltage operation; 3) increases process cost by requiring higher voltage devices; 4) increases product cost due to larger area of higher voltage devices; and/or 5) requires large/complex cascode circuitry to achieve high voltage operation using only low voltage devices.

These and other limitations of the prior art will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Several example embodiments will be described herein for transmitting digital signals between a first power domain and a second power domain. In certain embodiments the transmission of digital signals is unidirectional, and in other embodiment the transmission of digital signals can be bidirectional between the two power domains. In some embodiments, the terms "noisy" and "quiet" are used as labels only, it being understood that a noisy power domain is not always noisy and that a quiet power domain is not always quiet. However, in most applications, operating within the noise margin between the two power domains is desirable to reduce logic communication levels. For example, in certain embodiments a 50% noise margin for the logic family used in the two power domains is sufficient, while for other logic families a 10-20% noise margin meets specifications.

Figure 2A:
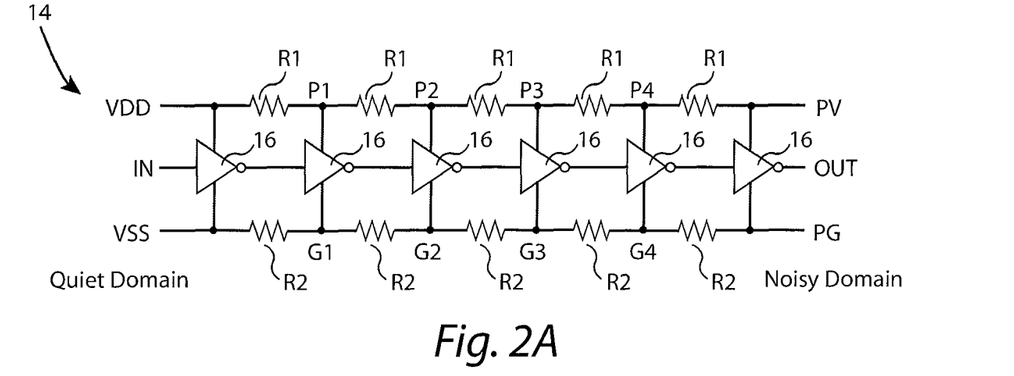
FIG. 2A is a schematic diagram of a first logic level shifter for transmitting data from a quiet power domain to a noisy power domain.

In FIG. 2A, a logic level shifter 14, set forth by way of example and not limitation, includes a string of inverters ("logic components") 16, a string of resistors ("resistive components") R1, and a string of resistors ("resistive components") R2. As will be discussed in greater detail subsequently, an inverter is one type of logic component, and a resistor is one type of resistive component. These terms may be used synonomously or separately, depending upon the context.

With continuing reference to FIG. 2A, a quiet domain comprising VDD, VSS and IN is at the input end of logic level shifter 14, while a noisy domain comprising PV, PG and OUT are at the output end of logic level shifter 14. In this non-limiting example, VSS and PG are nominally at ground and VDD and PV are nominally as the same voltage level, e.g. 2 volts DC. Power domains that have power rails that are nominally at the same voltage levels are sometimes referred to as "static." However, due to resistive and reactive factors, the rails of the noisy domain can "bounce", e.g. attain transient voltages different from the nominal voltage. For example, the PG ground rail might bounce by ½ V or even 1V or more, which creates a substantial differential in voltage levels between the quiet domain and the noisy domain.

In this non-limiting example, each of the resistors R1 are of approximately the same resistive value R1 and each of the resistors R2 are of approximately the same resistance value R2. Also, resistive value R1 can be approximately the same as resistive value R2. For example, the resistors R1 and R2 can be in the range of 100Ω-5,000Ω, and in another example can be about 1000Ω. The string of resistors R1 form a first voltage divider having nodes P1, P2, P3 and P4, and the string of resistors R2 form a second voltage divider having nodes G1, G2, G3 and G4. Each of the nodes P1, P2, P3 and P4 form an intermediate power rail and each of the nodes G1, G2, G3 and G4 form an intermediate ground rail, each of which are used, in this example, to drive only a single corresponding inverter 16.

Since there are, in this example, five resistors R1 and five resistors R2, the voltage difference between adjacent power rails is nominally $\frac{1}{5}^{th}$ of the voltage difference between VDD and PV. For example, if VDD is at 2 volts and PV is at 3 volts, power rail P1 is at about 2.2 volts, power rail P2 is at about 2.4 volts, power rail P3 is at about 2.6 volts and power rail p4 is at about 2.8 volts. Since the "bounce" of power rail PV is transitory, and the voltage difference applied to any single inverter 16 is divided, the inverters 16 can advantageously be built solely with 2 volt transistors, avoiding the costs and other disadvantages of using higher-voltage transistors.

It will therefore be appreciated that a level shifter including resistive dividers between PV and VDD, and between PG and VSS, creates intermediate power supply domains Pi/Gi (i=1, 2, 3 . . . N) such that intermediate logic gates (such as inverters 16) are exposed to only a fractional 1/N of the original ground bounce, and with a sufficiently large N, the use of higher voltage devices in these logic gates can be avoided.

It will be further appreciated that level shifter 14 uses two resistive dividers between VDD/PV and VSS/PG, respectively, such that the voltage differences between PV/PG and VDD/VSS are divided down through N resistor stages. In the present example, five stages of resistive dividers are used, although it will be appreciated that more or fewer stages can also be used. That is, an advantage of this approach is that the resistive divider can be expanded or reduced as needed to match the expected noise magnitude, where with each stage, the logic gates are exposed to 1/N of voltage difference between PV/PG and VDD/VSS. With sufficiently large N, only low voltage logic is needed in the design.

Figure 2B:
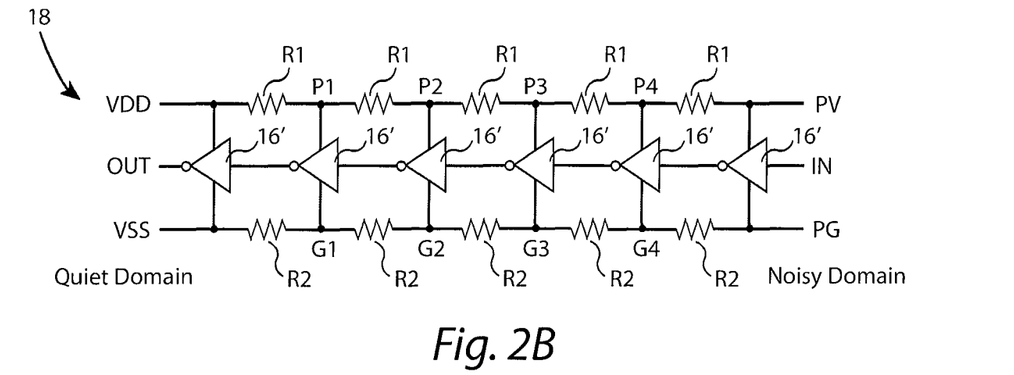
FIG. 2B is a schematic diagram of a second logic level shifter, which is essentially an inversion of the first logic level shifter, for transmitting data from a noisy power domain to a quiet power domain.

In FIG. 2B, a logic level shifter 18, set forth by way of example and not limitation, includes a string of inverters 16', a string of resistors R1, and a string of resistors R2, where like reference numbers refer to like components of the logic level shifter 14 described above with reference to FIG. 2A. Logic level shifter 18 is similar to logic level shifter 14 with the exception that the inverters 16' are oriented in an opposite direction compared to that of inverters 16, such that data is transmitted from a node IN of a noisy power domain PV/PG to a node OUT of a quiet power domain VDD/VSS. In other respects, the logic level shifter 18 operates in a similar manner as logic level shifter 15, described above.

Figure 3:
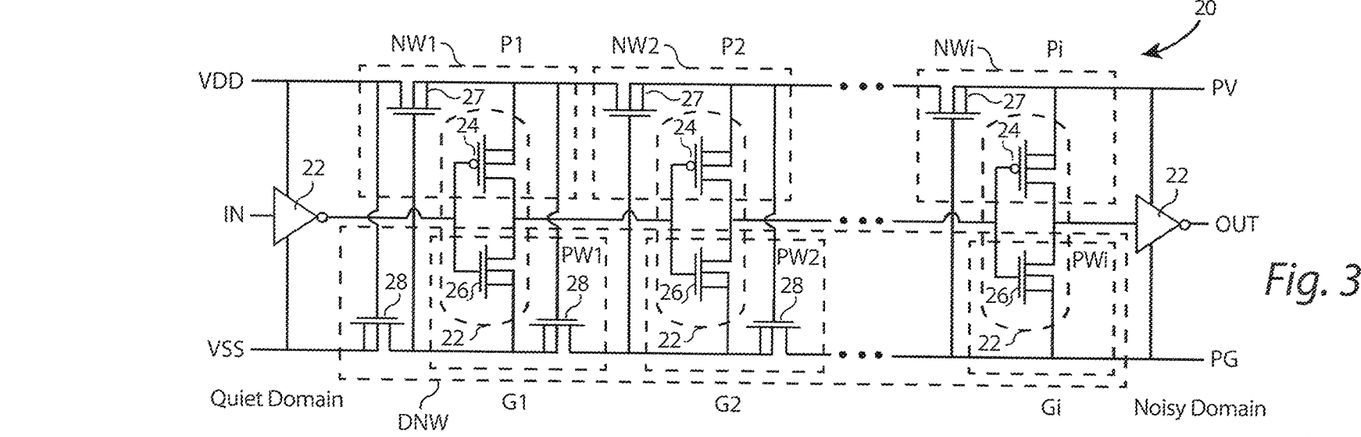
FIG. 3 is a schematic diagram of a third logic level shifter for transmitting data from a quiet power domain to a noisy power domain.

In FIG. 3, a logic level shifter 20, set forth by way of example and not limitation, includes a string of inverters 22, a string of resistors (PMOS transistors) 27, and a string of resistors (NMOS transistors) 28 providing an interface between a quiet power domain comprising power rail VDD and ground rail VSS and a noisy power domain comprising a power rail PV and a ground rail PG. In this example, the inverters (logic components) 22 comprise a PMOS transistor 24 and an NMOS transistor 26. The gates of the PMOS transistors (resistive components) 27 are coupled to a ground rail, and the gates of the NMOS transistors (resistive components) 28 are coupled to a power rail. The transistors 27 and 28 are configured and sized to provide a desired resistance, as described above by way of non-limiting example with respect to logic level shifter 14 of FIG. 2A. It will therefore be appreciated that the logic level shifter 20 operates in a similar fashion as to the operation of logic level shifter 14.

In FIG. 3, there are "I" stages of intermediate power supply domains (P1/G1 to Pi/Gi) divided through FETs operating in their linear region as resistors. In a typical bulk CMOS process, the PMOS resistive components 27 can share the same N-well (e.g. N-wells NW1-NWi) as their corresponding PMOS logic transistors 24, while NMOS resistive components can share the same P-well (e.g. P-wells PW1-PWi) as their corresponding NMOS logic transistors 26. For additional area savings, in this example, P-wells PW1-PWi share the same deep N-well (DNW). Each PMOS N-well is tied to the corresponding local power domain, while the DNW is tied to the VDD rail. DNW connections limit the PG ringing magnitude, to which the level shifter can tolerate, to be less than VDD-VSS.

Figure 4:
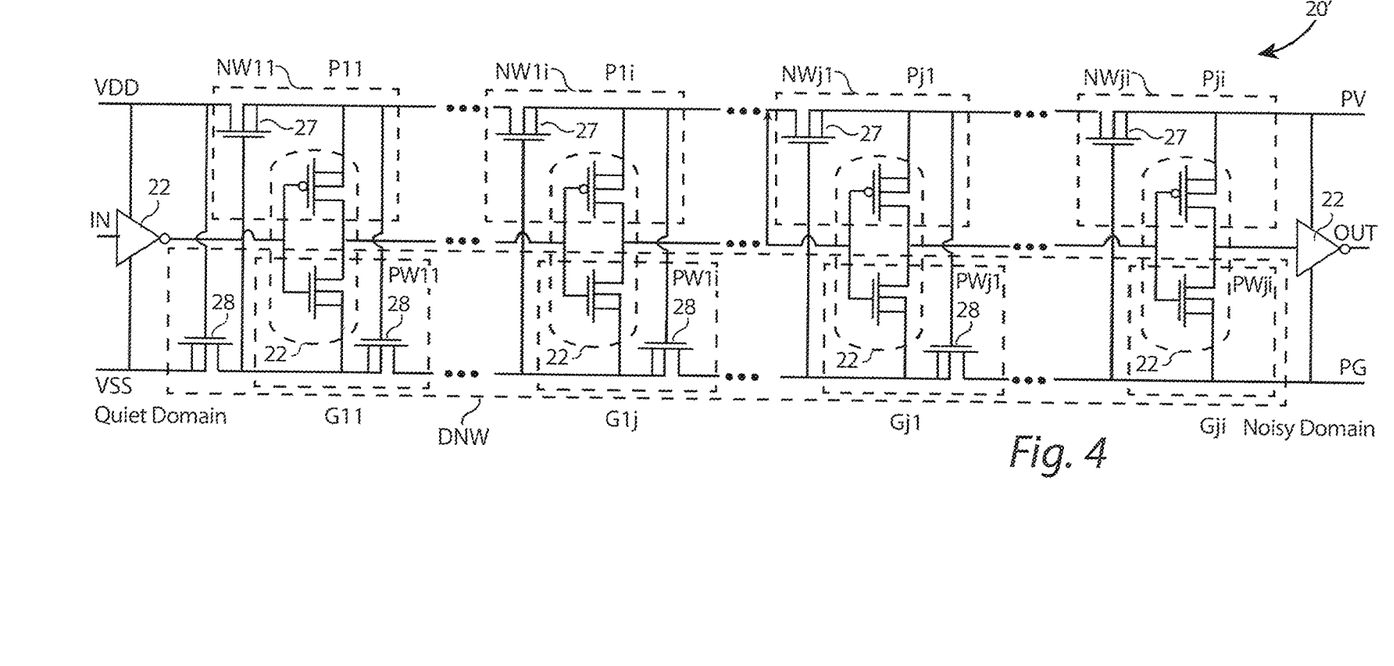
FIG. 4 is a schematic diagram of a fourth logic level shifter for transmitting data from a quiet power domain to a noisy power domain.

In FIG. 4, an example logic level shifter 20' operates in a similar fashion to the logic level shifter 20, and like reference numerals refer to like components. To tolerate PG ringing magnitudes larger than VDD-VSS, the divider chain of logic level shifter is partitioned into multiple pockets (e.g. pockets PW11 to PW1$i$ and PWj1 to PWji), where the P-well in each pocket can share the same DNW (e.g. pockets PW11 to PW1$i$ share DNW1 and pockets PWj1 to PWji share DNWj), which are tied to the associated power supply rail, as shown by arrows in FIG. 4. With this configuration, PG ringing magnitudes larger than VDD-VSS can be tolerated.

Figure 5A:
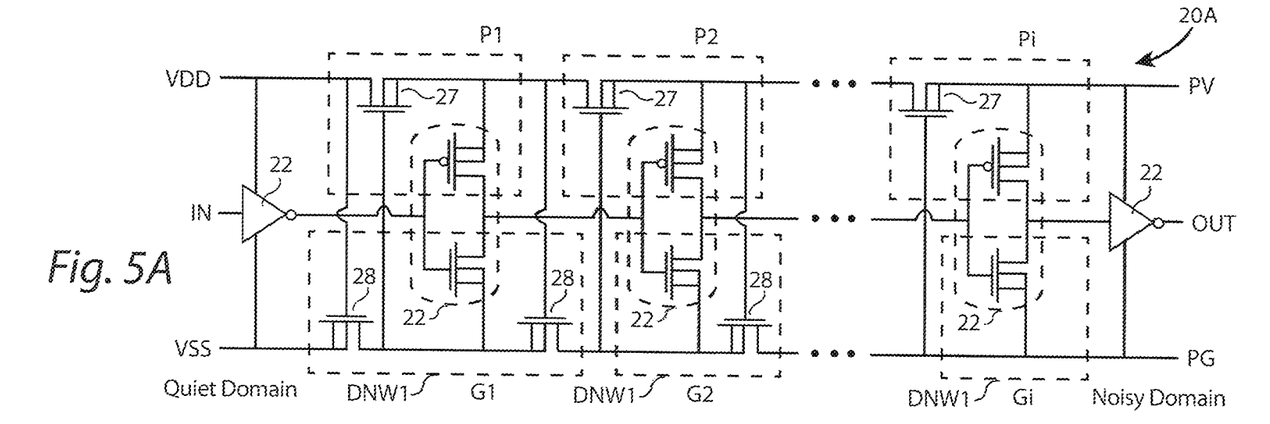
FIG. 5A is a schematic diagram of a fifth logic level shifter for transmitting data from a quiet power domain to a noisy power domain.

In FIG. 5A, an example logic level shifter 20A is configured similarly to the example logic level shifter 20 of FIG. 3, where like reference numerals refer to like components. In this example, multiple level shifter chains share isolation wells DNWi to reduce total area. Power supply rail attenuators can also be shared. It will therefore be appreciated that logic level shifter 20" includes multiple level shifters sharing the resistive component divider chains, with the N-well DNW partitioned by stage instead of by chain.

Figure 5B:
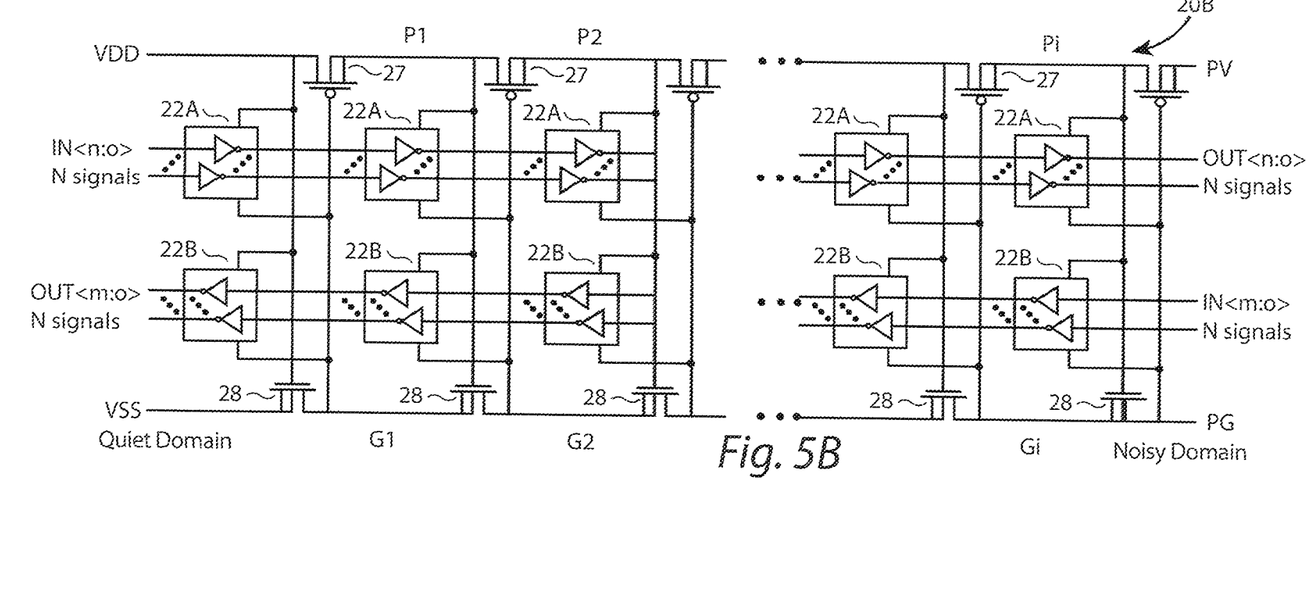
FIG. 5B is a schematic diagram of a sixth logic level shifter for transmitting data bidirectionally between a quiet power domain and a noisy power domain.

In FIG. 5B, an example logic level shifter 20B includes multiple level shifters with bi-directional signals sharing a resistive divider chain. In this embodiment, inverters 22A comprise a string of inverters <n:0> that share the same string of resistive components 27 and the same string of resistive components 28 to provide multiple data paths from the quiet domain to the noisy domain. This example embodiment also includes inverters 22B that comprise a string of inverters <m:0> that point in the opposite direction to the inverters 22A and which share the same string of resistive components 27 and the same string of resistive components 28 to provide multiple data paths from the noisy domain to the quiet domain. This example embodiment, therefore, provides bidirectional communications between the quiet domain and the noisy domain along multiple paths.

Figure 6:
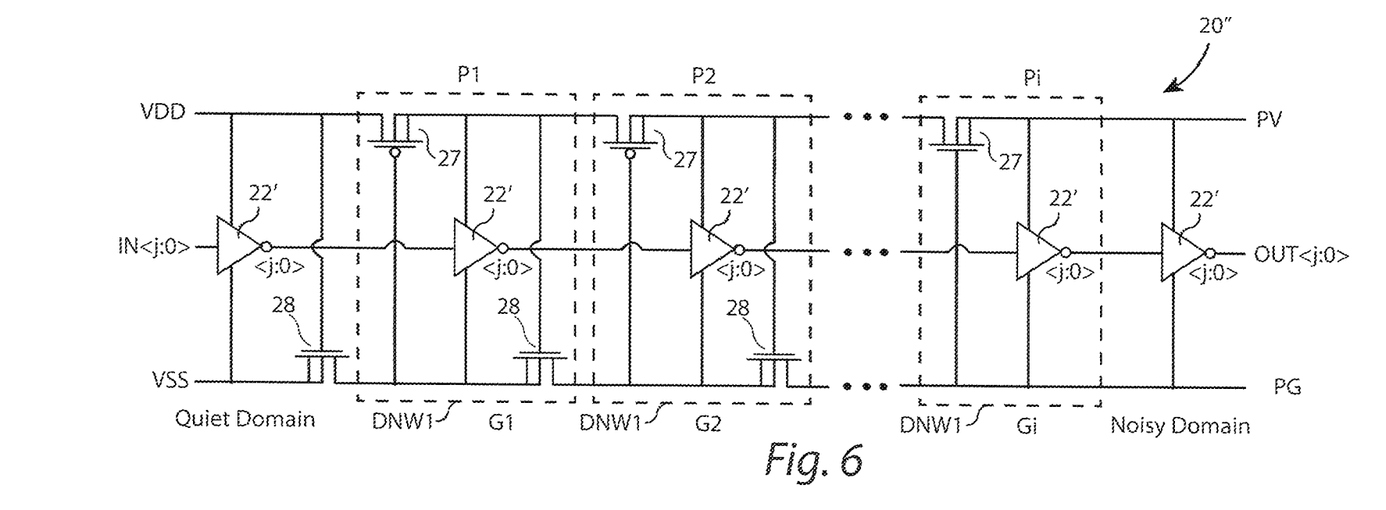
FIG. 6 is a schematic diagram of a seventh logic level shifter for transmitting data between a quiet power domain and a noisy power domain.

In FIG. 6, an example logic level shifter 20''' is configured similarly to the example logic level shifter 20A of FIG. 5A, where like reference numerals refer to like components. In this example, the inverters 22' comprise one or more strings of inverters <j:0> that share the same string of resistive components 27 and the same string of resistive components 28. With this configuration, multiple data paths can be provided between the quiet domain and the noisy domain. It should be noted the string of inverters 22'<j:0> can be provided in either direction, as was the case with the example logic level shifter 20B of FIG. 5B, such that the data can flow either from IN<j:0> to OUT<j:0>, or vice versa, or simultaneously some portion in each direction, while still sharing the same resistive components 27 and 28 and N-wells DNW1-DNWi.

Figure 7:
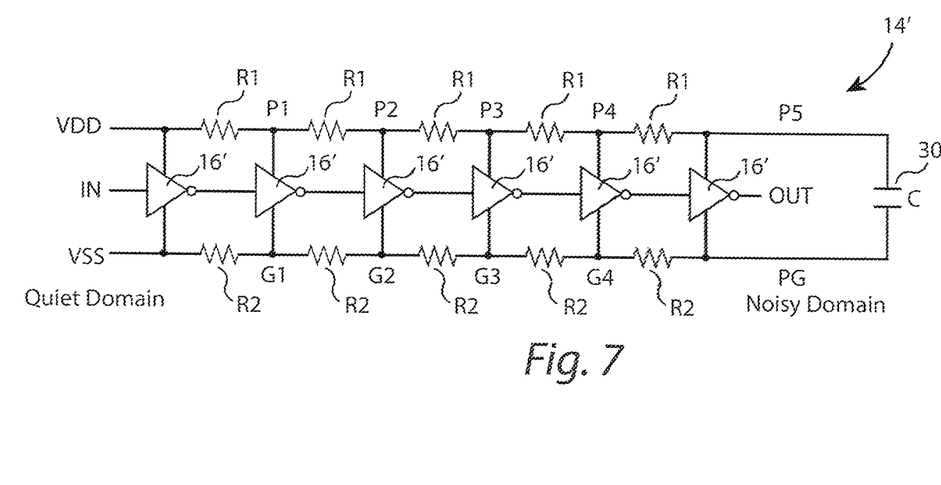
FIG. 7 is a schematic diagram of an eighth logic level shifter for transmitting data between a quiet power domain and a noisy power domain where only a single positive rail is available.

In FIG. 7, a logic level shifter 14' is configured similarly to logic level shifter 14 of FIG. 2A, with like references referring to like components. However, logic level shifter 14' includes a bypass capacitor C that develops a power domain P5 for a system without PV voltage. That is, the fourth rail terminal P4 voltage level is developed by powering bypass capacitor C from VDD and connecting/referencing to PG. This configuration is advantageous where VDD/VSS/PG are power input pins to the level shifter 14, and PV is not, such that a floating rail node P5 is internally created to supply voltage referenced to the PG domain, but powered by VDD.

It will be appreciated that the forgoing examples are just that, merely examples, and that other configurations can be provided to attain the desired results. For example, the series or "string" of resistors on the power supply rails between the power domains can be replaced by many types of components including resistors, transistors, resistive polysilicon connections, resistive interconnects, diffusions, metal connections, and/or other resistive or reactive (inductive) components. Furthermore, the string of resistive components can be explicit components, selected parasitic elements, or combinations of the two. Likewise, the string of inverters can be replaced or augmented by other logic components such as NAND gates, NOR gates, etc.; and furthermore that single inverters or other active components in each power domain (Pi/Gi, i=1, 2, 3, 4 . . . ) can be replaced by multiple inverters in parallel to create a multi-input multi-output level shifter or differential IN/OUT level shifter, of which the logic level shifter 20''' of FIG. 6 is only one example.

Advantages of various example embodiments disclosed herein are that they allow the transmission of digital signals between a quiet voltage domain and a noisy voltage domain, and vice versa, preventing logic errors and product malfunctions in a wide range of power supply products. Additionally, these solutions can be implemented using only low voltage devices, which decreases propagation delay, relaxes process requirements, and typically reduces the fabrication cost.

It will also be appreciated that a method for transmitting a digital signal between power domains has been disclosed herein. By way of non-limiting example, a method for transmitting digital signals between power domains includes: providing a string of logic components having at least one data input in a first power domain and at least one data output in a second power domain, where the first power domain has a first power rail and a second power rail and the second power domain has a first power rail and a second power rail; providing a plurality of intermediate first power rails and a plurality of intermediate second power rails between the first power domain and the second power domain; powering the string of logic components with the plurality of intermediate first power rails and plurality of intermediate second power rails; and applying digital signals to the data input for transmission to the data output.

It will be further appreciated that a logic level shifter interface between power domains has been disclosed herein. By way of non-limiting example, a logic level shifter interface includes: a string of logic components communicating between a first power domain and a second power domain, the string of logic components having at least one input and at least one output; a first string of resistive components connecting a first power rail of the first power domain to a first power rail of the second power domain and having a plurality of intermediate first power rails at nodes between adjacent resistive components of the first string of resistive components; and a second string of resistive components connecting a second power rail of the first power domain to a second power rail of the second power domain and having a plurality of intermediate second power rails at nodes between adjacent resistive components of the second string of resistive components; wherein at least one logic component is powered by an intermediate first power rail of the first string of resistive components and an intermediate second power rail of the second string of resistive components. The logic components can be one or more inverters, logic gates (e.g. NAND, NOR gates), etc.

It should also be noted that the ground rails need not be nominally zero volts. By way of non-limiting examples, ground rails can be non-zero, e.g. ±1V, +4V, +2V, −3V, etc. It will therefore be understood that by "ground rail" and "power rail" it is meant herein to mean the same thing as "negative rail" and "positive rail", or "positive rail" and "more positive rail", or "more negative rail" and "negative rail." In other words, as used herein, there is a positive potential between the "ground rail" and the "power rail", but that each of the ground rail and power rail can be of a positive, negative, or zero potential in absolute terms.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A logic level shifter interface between power domains comprising:
    a string of logic components communicating between a first power domain and a second power domain, the string of logic components having at least one input and at least one output;
    a first string of resistive components directly connecting a first power rail of the first power domain to a first power rail of the second power domain and having a plurality of intermediate first power rails at nodes between adjacent resistive components of the first string of resistive components; and
    a second string of resistive components directly connecting a second power rail of the first power domain to a second power rail of the second power domain and having a plurality of intermediate second power rails at nodes between adjacent resistive components of the second string of resistive components;
    wherein at least one logic component is powered by an intermediate first power rail of the first string of resistive components and an intermediate second power rail of the second string of resistive components.

2. A logic level shifter interface between power domains as recited in claim 1 wherein the resistive elements include one or more of resistors, transistors, resistive polysilicon connections, resistive interconnects, diffusions, and metal connections.

3. A logic level shifter interface between power domains as recited in claim 1 wherein the resistive elements can be explicit components, parasitic elements, or combinations of explicit components and parasitic elements.

4. A logic level shifter interface between power domains as recited in claim 1 wherein at least one of the power rails of the second power domain is derived from a power rail of the first power domain using a bypass capacitor.

5. A logic level shifter interface between power domains as recited in claim 1 wherein one or more of a well, a pocket, or an isolation region of a semiconductor substrate on which the logic components are formed, is shared.

6. A logic level shifter interface between power domains as recited in claim 5 wherein multiple level shifters share one or more of the wells, pockets, or isolation regions.

7. A logic level shifter interface between power domains as recited in claim 1 wherein one of the first power rail of the first power domain and the second power rail of the first power domain is at a positive equipotential with respect to the other one of the first power rail of the first power domain and the second power rail of the first power domain.

8. A logic lever shifter interface between power domains as recited in claim 7 wherein the other one of the first power rail of the first power domain and the second power rail of the first power domain is grounded.

9. A logic level shifter interface between power domains as recited in claim 1 wherein one of the first power rail of the second power domain and the second power rail of the second power domain is at a positive equipotential with respect to the other one of the first power rail of the second power domain and the second power rail of the second power domain.

10. A logic lever shifter interface between power domains as recited in claim 9 wherein the other one of the first power rail of the second power domain and the second power rail of the second power domain is grounded.

11. A logic level shifter between power domains as recited in claim 1 wherein the string of logic components comprise a plurality of inverters.

12. A logic level shifter interface between a quiet power domain and a noisy power domain comprising:
    a string of inverters communicating between a quiet power domain and a noisy power domain, the string of inverters having at least one digital data input and at least one digital data output, wherein the inverters have a logic level voltage;
    a first string of resistive components directly connecting a first power rail of the quiet power domain to a first power rail of the noisy power domain and including a plurality of intermediate first power rails at nodes between adjacent resistive components of the first string of resistive components; and
    a second string of resistive components directly connecting a second power rail of the quiet power domain to a second power rail of the noisy power domain and including a plurality of intermediate second power rails at nodes between adjacent resistive components of the second string of resistive components;
    wherein at least one inverter is powered by an intermediate first power rail of the first string of resistive components and an intermediate second power rail of the second string of resistive components; and
    wherein a noise margin comprising a difference between an output of the quiet power domain and an input of the noisy power domain does not exceed 50% of the logic level voltage of the inverters.

13. A logic level shifter interface between a quiet power domain and a noisy power domain as recited in claim 12 wherein the noise margin does not exceed 20%.

14. A logic level shifter interface between a quiet power domain and a noisy power domain as recited in claim 12 wherein the noise margin does not exceed 10%.

15. A logic level shifter interface between a quiet power domain and a noisy power domain as recited in claim 12 wherein both the quiet power domain and the noisy power domain are quiet.

16. A logic level shifter interface between a quiet power domain and a noisy power domain as recited in claim 12 wherein both the quiet power domain and the noisy power domain are noisy.

17. A method for transmitting digital signals between power domains comprising:
   providing a string of logic components having a data input in a first power domain and a data output in a second power domain, where the first power domain has a first power rail and a second power rail and the second power domain has a first power rail and a second power rail;
   providing a plurality of intermediate first power rails and a plurality of intermediate second power rails between the first power domain and the second power domain by directly connecting a first string of resistive components between the first power rail of the first power domain and the first power rail of the second power domain and by directly connecting a second string of resistive components between the second power rail of the first power domain and the second power rail of the second power domain;
   powering the string of logic components with the plurality of intermediate first power rails and plurality of intermediate second power rails; and
   applying digital signals to the data input of the first power domain for transmission to the data output of the second power domain.

18. A method for transmitting digital signals between power domains as recited in claim 17 wherein data signals are transmitted unidirectionally from the first power domain to the second power domain.

19. A method for transmitting digital signals between power domains as recited in claim 17 wherein the string of logic components further include a data input in the second power domain and a data output in the first power domain, and further comprising applying digital signals to the data input of the second power domain for transmission to the data output of the first power domain.

20. A method for transmitting digital signals between power domains as recited in claim 19 wherein data signal are transmitted bidirectionally between the first power domain and the second power domain.

* * * * *